(12) United States Patent
Roberts et al.

(10) Patent No.: US 8,381,393 B2
(45) Date of Patent: Feb. 26, 2013

(54) PATCH ON INTERPOSER THROUGH PGA INTERCONNECT STRUCTURES

(75) Inventors: Brent M. Roberts, Phoenix, AZ (US);
Mihir K. Roy, Chandler, AZ (US);
Sriram Srinivasan, Chandler, AZ (US);
Sridhar Narasimhan, Chandler, CA (US)

(73) Assignee: Intel Corporation, Santa Clara, CA (US)

( * ) Notice: Subject to any disclaimer, the term of this patent is extended or adjusted under 35 U.S.C. 154(b) by 482 days.

(21) Appl. No.: 12/655,406

(22) Filed: Dec. 30, 2009

(65) Prior Publication Data

US 2011/0157808 A1 Jun. 30, 2011

(51) Int. Cl.
*H01K 3/10* (2006.01)

(52) U.S. Cl. .......................... 29/825; 257/696; 257/726

(58) Field of Classification Search .................. 29/825
See application file for complete search history.

(56) References Cited

U.S. PATENT DOCUMENTS

| | | | | |
|---|---|---|---|---|
| 6,230,400 | B1 * | 5/2001 | Tzanavaras et al. | 29/840 |
| 6,706,546 | B2 * | 3/2004 | Yoshimura et al. | 438/31 |
| 7,279,366 | B2 * | 10/2007 | Bolken | 438/125 |
| 7,629,680 | B2 * | 12/2009 | Roberts et al. | 257/691 |
| 8,110,500 | B2 * | 2/2012 | Mutnury et al. | 438/667 |
| 2002/0134582 | A1 * | 9/2002 | Celaya et al. | 174/261 |
| 2008/0178463 | A1 * | 7/2008 | Okubora | 29/830 |
| 2009/0113698 | A1 * | 5/2009 | Love et al. | 29/739 |
| 2009/0321932 | A1 * | 12/2009 | Gonzalez et al. | 257/750 |
| 2010/0075514 | A1 * | 3/2010 | Williams | 439/66 |
| 2010/0083496 | A1 * | 4/2010 | Audette et al. | 29/842 |
| 2010/0109142 | A1 * | 5/2010 | Toh et al. | 257/690 |
| 2010/0147574 | A1 * | 6/2010 | Kaneko et al. | 174/261 |
| 2010/0314730 | A1 * | 12/2010 | Labeeb | 257/676 |

* cited by examiner

*Primary Examiner* — Anthony Q Edwards
(74) *Attorney, Agent, or Firm* — Winkle, PLLC

(57) ABSTRACT

Methods of forming a microelectronic structure are described. Embodiments of those methods include attaching a patch to an interposer, forming at least one interconnect structure above and on a top surface of the interposer; and attaching a flex connector to the at least one interconnect structure.

30 Claims, 6 Drawing Sheets

PATCH ON INTERPOSER THROUGH PGA INTERCONNECT STRUCTURES

BACKGROUND OF THE INVENTION

Integrated circuits typically include various active and passive circuit elements which have been integrated into a piece of semiconductor material, often referred to as a die. The die may, in turn, be encapsulated into a package. Various package designs have been utilized, such as for example, the pin grid array (PGA), ball grid array (BGA) and land grid array (LGA) packages. The die package may then be attached to another substrate, such as a circuit board, in some cases.

BRIEF DESCRIPTION OF THE DRAWINGS

While the specification concludes with claims particularly pointing out and distinctly claiming certain embodiments of the present invention, the advantages of this invention can be more readily ascertained from the following description of the invention when read in conjunction with the accompanying drawings in which:

DETAILED DESCRIPTION OF THE PRESENT INVENTION

Figure 1A:
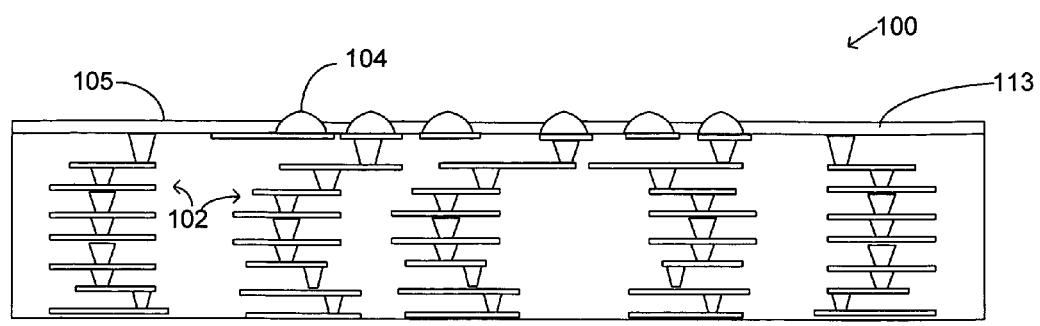
FIGS. 1a-1j represent methods of forming structures according to an embodiment of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

Methods and associated structures of forming and utilizing a microelectronic structure, such as a package structure, are described. Those methods may include attaching a patch to an interposer, forming at least one interconnect structure above and on a top surface of the interposer; and attaching a flex connector to the at least one interconnect structure. Various embodiments included herein enable flexible connection for patch on interposer packaging structures through pin grid array interconnects.

FIGS. 1a-1k illustrate an embodiment of a method of forming a microelectronic structure, such as a patch on interposer structure, for example. FIG. FIGS. 1a-1k illustrate embodiments of methods of forming microelectronic structures, such as patch on interposer (PoINT) structures, for example. FIG. 1a illustrates an interposer 100. In one embodiment, the interposer 100 may comprise a laminated interposer design with stacked laser fabricated via structures 102.

The stacked via structures 102 may act as vertical interconnect structures within the interposer 100, wherein the vertical interconnect structures may be stacked upon each other. The interposer 100 may further comprise interconnect structures 104 on a top surface 105 of the interposer 100. In an embodiment, the array of interconnect structures 104 may comprise mid level interconnect (MLI) solder balls, such as but not limited to MLI ball all grid array solder balls. The interposer may comprise a dielectric material 113.

Figure 1B:
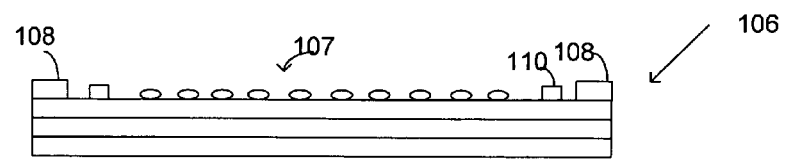

FIG. 1b depicts a patch structure 106. In an embodiment, the patch structure 106 may comprise a thin core (about 400 microns in thickness, for example) patch structure 106. In embodiments, the patch structure 106 may support routing (RTG) and power delivery (PD) functions of a microelectronic device/system. In an embodiment, the patch structure 106 may comprise a stiffener 108 and a die side capacitor (DSC) 110. The patch structure 106 may further comprise patch interconnect structures 107, which may comprise solder balls in some embodiments.

Figure 1C:
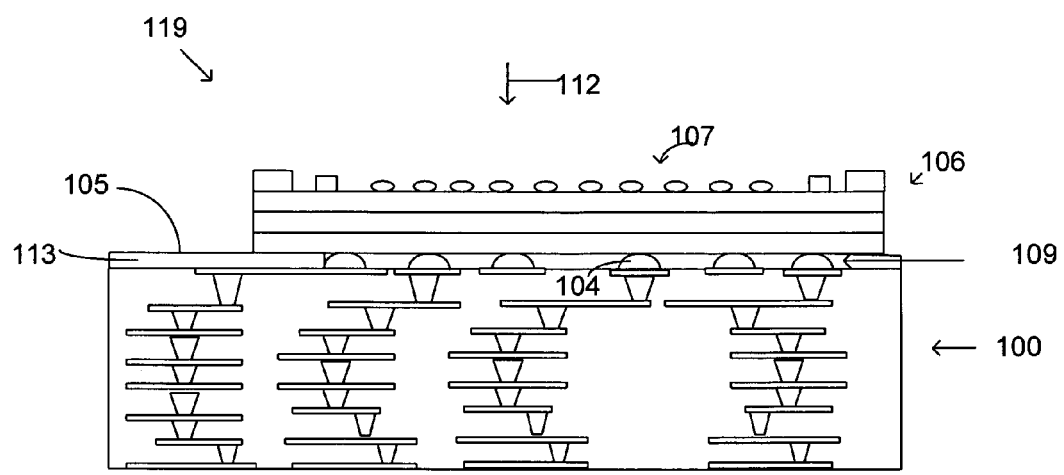

In an embodiment, the patch structure 106 may be attached to the interposer 100 through mid level interconnects (MLI) BGA connections 104 to form a patch on interposer structure 119 (FIG. 1c). The attachment of the patch structure 106 to the MLI 104 of the interposer 100 may be performed by a thermal compressive bonding (TCB) process 112. In some embodiments, the TCB process 112 may comprise at least one of a miniball (reduced diameter solder ball) or a surface mount technology (SMT) attachment process, such as by utilizing a LGA-like pad with solder paste on the interposer. In an embodiment, the attachment of the patch structure 106 to the MLI 104 of the interposer 100 may be performed by a thermal compressive bonding (TCB) process 112 and/or a BGA/surface mount reflow process by utilizing solder paste/flux on mating pads disposed on the interposer 100.

In an embodiment, the TCB process 112 may enable localized heating of the MLI 104, thus not subjecting the entire patch on interposer structure 119 to the heating process and thus reduces the impact that temperature has on warpage of the patch on interposer structure 119. In an embodiment, a solder joint 109 may attach/join the patch structure 106 to the interposer 100.

Figure 1D:
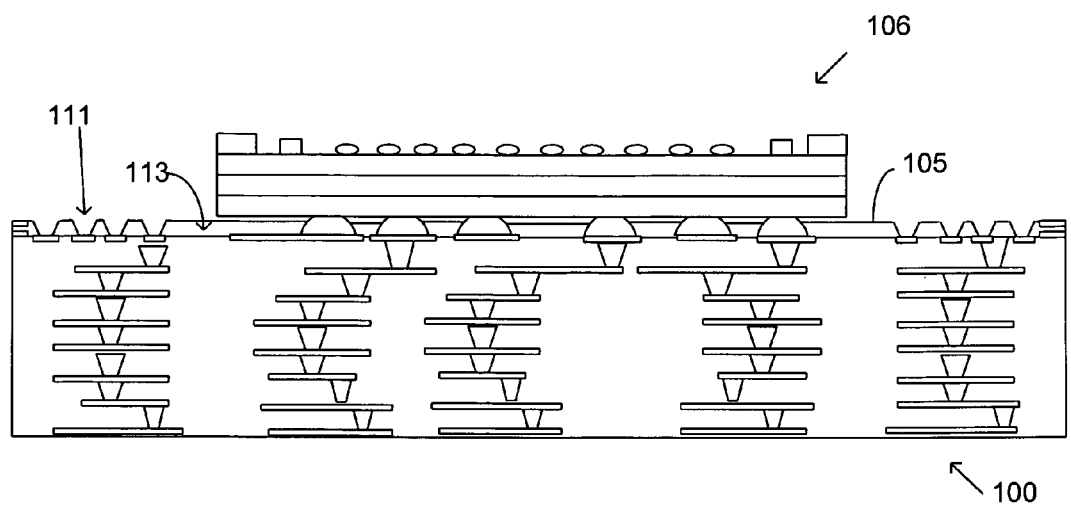
Figure 1E:
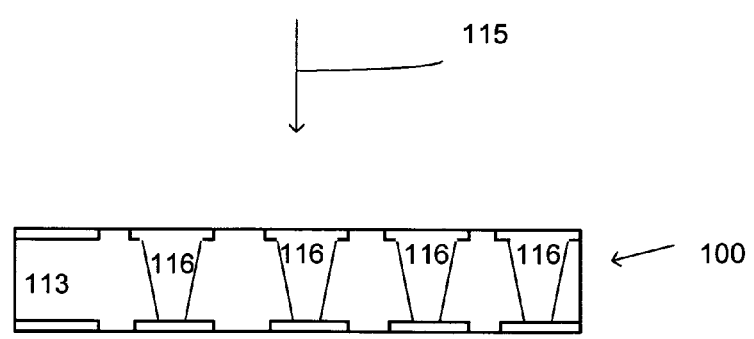
Figure 1F:
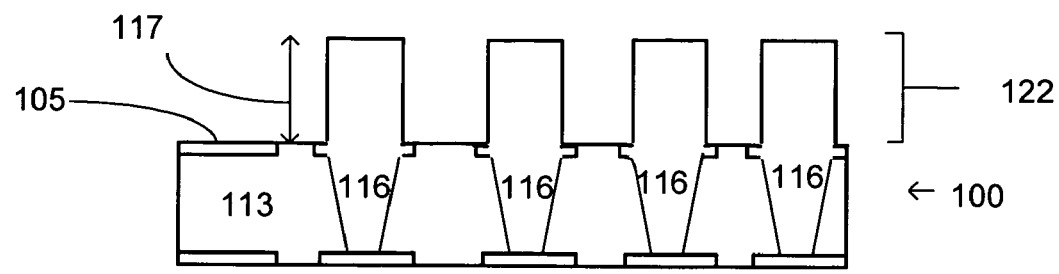

In one embodiment, a plurality of vias 111 may be formed in a dielectric material 113 disposed on the top surface 105 of the interposer 100 (FIG. 1d). FIG. 1e depicts a view of a portion of the dielectric material 113 of the interposer 100 after the plurality of vias 111 have undergone a plating process 115 to fill the vias 111 with a conductive material 116. FIG. 1f depicts further plating of the conductive material 116 to a height 117 above the top surface 105 of the dielectric material 113 of the interposer 100, to form at least one/a plurality of interconnect structure(s) 122. The height 117 of the interconnect structures 122 may depend upon the particular application, but in some embodiments may comprise between about 1-2 mm (100-200 microns). The number of interconnect structures 122 may vary, but may comprise greater than about 3 substantially equally spaced interconnect structures 122 in some cases.

In an embodiment, the plurality of interconnect structures 122 may comprise pin grid array structures. In an embodiment, the interconnect structures 122 are formed above and on a top surface of the conductive material 116. In an embodiment, plating the interconnect structures 122 are plated in situ on/in interposer 100 via multi-pass plating unlike typical prior solder mounted pin interconnect structures. Thus the interconnect structures of the various embodiments herein provide improved positional accuracy and a shorter z-height for packaging structures utilizing the embodiments.

Figure 1G:
Figure 1H:
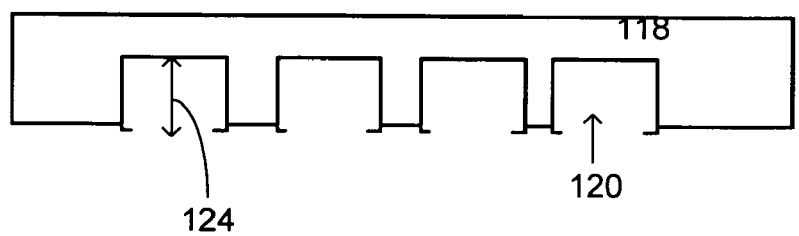
Figure 1I:
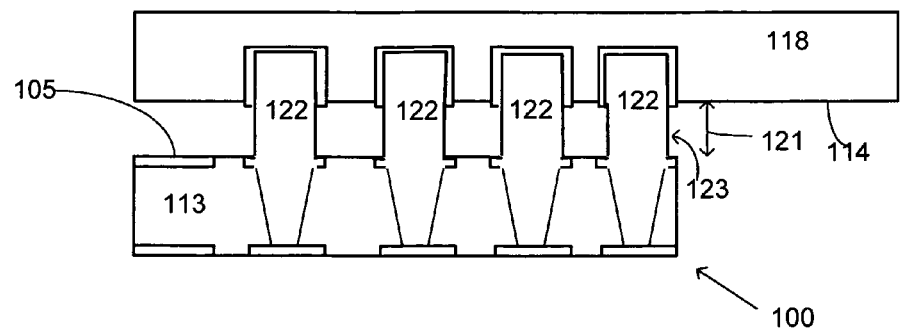

A flex structure 118, which may comprise a flex connector 118, is depicted in FIG. 1g. In one embodiment, openings 120 may be formed in the flex connector 118 (FIG. 1h). The openings 120 may comprise PGA cavities in some cases. The openings 120 may be created by laser drilling the openings and then plating/lining them with copper connections, in some embodiments. The openings 120 may comprise a depth 124 that may allow the interconnect structures 122 of FIG. 1f to be placed into the openings 120. The flex connector 118 comprising the openings 120 may be attached to the top surface 105 of the interposer 100 (FIG. 1i). In an embodiment, the interconnect structures 122 may be placed/inserted into the openings 120 of the flex structure 118. Thus, embodiments of the invention enable the attachment of a flex connector 118 on an interposer 100 through in situ PGA interconnect structures 122.

In an embodiment, there may be a separation between a bottom portion 114 of the flex connector 118 and the top portion 105 of the interposer 100. In an embodiment, the interconnect structures 122 may comprise a portion 123 that is above the top surface of the interposer 100 and below a bottom surface 114 of the flex connector 118. A height 121 (which may comprise a Z-height 121, in some cases) of the portion 123 of the interconnect structure 122 may vary depending upon the particular application. In an embodiment, the flex structure 118 may be attached to end portions 125 of the interposer 100, adjacent to, but not touching, the patch structure 106 (FIG. 1j).

A die 124 may be attached to the patch structure 106 to form package structure 126. In an embodiment, an underfill material (not shown) may be applied to the MLI region 104 of the interposer 100 prior to the die 124 attachment to the patch structure 106. In other embodiments, the underfill material may be applied after the die 124 attach.

Figure 2:
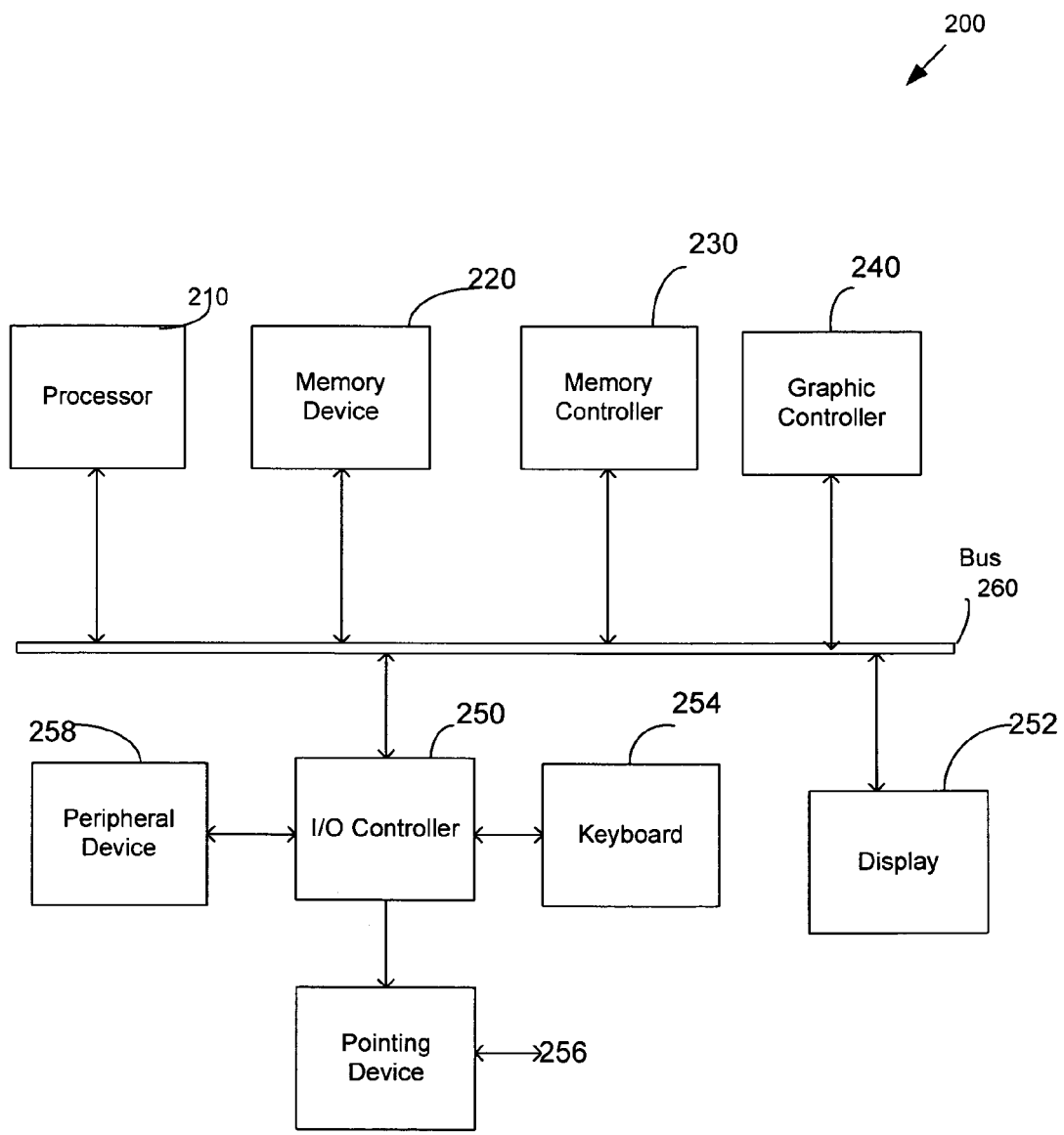
FIG. 2 represents a system according to an embodiment of the present invention.

FIG. 2 shows a computer system according to an embodiment of the invention. System 200 includes a processor 210, a memory device 220, a memory controller 230, a graphics controller 240, an input and output (I/O) controller 250, a display 252, a keyboard 254, a pointing device 256, and a peripheral device 258, all of which may be communicatively coupled to each other through a bus 260, in some embodiments. Processor 210 may be a general purpose processor or an application specific integrated circuit (ASIC). I/O controller 250 may include a communication module for wired or wireless communication. Memory device 220 may be a dynamic random access memory (DRAM) device, a static random access memory (SRAM) device, a flash memory device, or a combination of these memory devices. Thus, in some embodiments, memory device 220 in system 200 does not have to include a DRAM device.

Figure 1J:
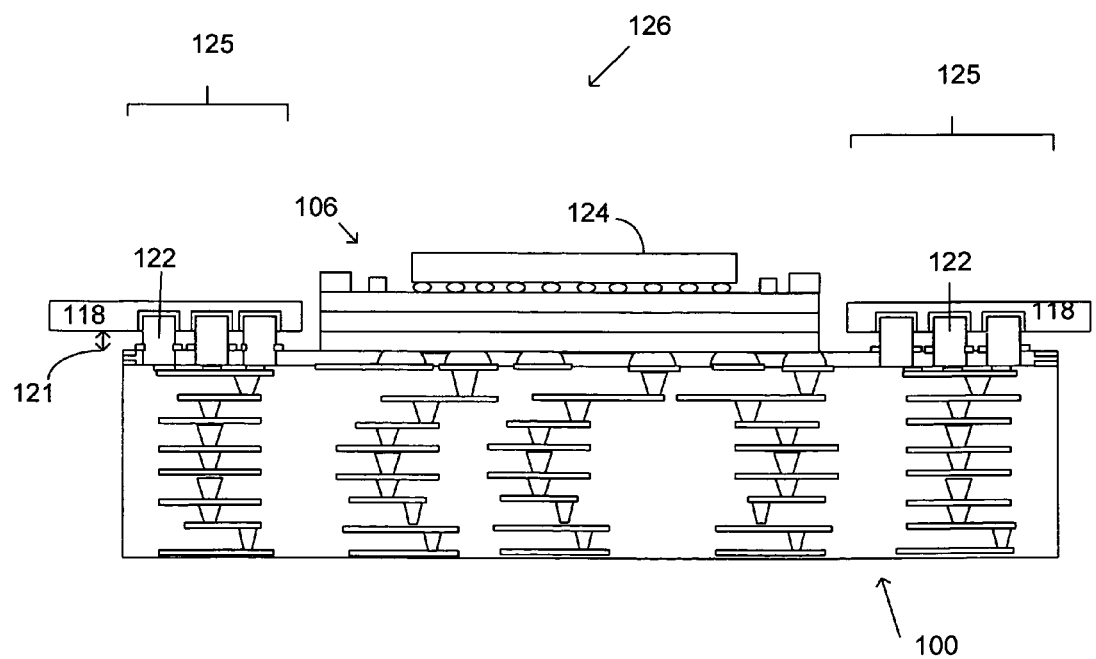

One or more of the components shown in system 200 may be included in/and or may include one or more integrated circuit packages, such as the package structure of FIG. 1j for example. For example, processor 210, or memory device 220, or at least a portion of I/O controller 250, or a combination of these components may be included in an integrated circuit package that includes at least one embodiment of the structures herein.

These elements perform their conventional functions well known in the art. In particular, memory device 220 may be used in some cases to provide long-term storage for the executable instructions for a method for forming package structures in accordance with embodiments of the present invention, and in other embodiments may be used to store on a shorter term basis the executable instructions of a method for forming package structures in accordance with embodiments of the present invention during execution by processor 310. In addition, the instructions may be stored, or otherwise associated with, machine accessible mediums communicatively coupled with the system, such as compact disk read only memories (CD-ROMs), digital versatile disks (DVDs), and floppy disks, carrier waves, and/or other propagated signals, for example. In one embodiment, memory device 220 may supply the processor 210 with the executable instructions for execution.

System 200 may include computers (e.g., desktops, laptops, hand-helds, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

Benefits of the embodiments included herein include the enablement of patch on interposer substrate packaging technology. The embodiments enable flex interconnect with patch on interposer, which improves server package affordability. The embodiments enable flex connection by in situ built PGA in the interposer. The PGA interconnects may formed by multi-pass plating processing rather than prior art external solder attached pins, which improves positional accuracy for the flex connection and alleviates/eliminates bent pins, while lowering package Z-height. Through PGA connection, the loading mechanism can be accommodated at a smaller real estate impact on an interposer (or board), and thus eliminated LLCR (Low Level Contact Resistance) concerns.

Although the foregoing description has specified certain steps and materials that may be used in the method of the present invention, those skilled in the art will appreciate that many modifications and substitutions may be made. Accordingly, it is intended that all such modifications, alterations, substitutions and additions be considered to fall within the spirit and scope of the invention as defined by the appended claims. In addition, it is appreciated that various microelectronic structures, such as package structures, are well known in the art. Therefore, the Figures provided herein illustrate only portions of an exemplary microelectronic structure that pertains to the practice of the present invention. Thus the present invention is not limited to the structures described herein.

What is claimed is:

1. A method comprising;
   attaching a patch to an interposer;
   forming at least one interconnect structure above and on a top surface of the interposer; and
   attaching a flex connector to the at least one interconnect structure.

2. The method of claim 1 further comprising wherein the patch is attached to the interposer by at least one of thermal compression bonding and a surface mount reflow process using at least one of a solder paste and a flux.

3. The method of claim 1 further comprising forming vias in the interposer.

4. The method of claim 3 further comprising plating a conductive material in the vias.

5. The method of claim 4 further comprising plating the conductive material above a top surface of the interposer.

6. The method of claim 1 wherein the wherein the patch structure comprises a thin core.

7. The method of claim 1 further comprising wherein one of the at least one interconnect structure is placed into one of at least one opening in the flex connector.

8. The method of claim 1 wherein a portion of the at least one interconnect structure is above the top surface of the interposer and below a bottom surface of the flex connector.

9. The method of claim 1 further comprising wherein the at least one interconnect structures comprises a pin grid array structure that is plated up from a via in the interposer.

10. A method comprising;
attaching a patch to an interposer;
forming a via in a dielectric material of the interposer;
forming a conductive material in the via;
forming an interconnect structure above and on a top surface of the conductive material;
forming an opening in a flex connector; and
attaching the flex connector to the interconnect structure.

11. The method of claim 10 further comprising wherein the patch structure comprises a thin patch structure.

12. The method of claim 10 further comprising wherein the interconnect structure is formed by plating up the conductive material above a top surface of the interposer.

13. The method of claim 10 further comprising wherein the patch is attached to the interposer by at least one of thermal compression bonding and a surface mount reflow process using at least one of a solder paste and a flux.

14. The method of claim 10 wherein the interconnect structure is inserted into the opening of the flex connector.

15. The method of claim 10 further comprising wherein the openings of the flex connector comprise PGA cavities.

16. A structure comprising:
a patch disposed on an interposer;
at least one interconnect structure disposed above and on a top surface of the interposer; and
a flex connector connected to the at least one interconnect structure.

17. The structure of claim 16 wherein the at least one interconnect structure is further disposed in a dielectric material of the interposer.

18. The structure of claim 16 wherein the patch structure comprises a thin core.

19. The structure of claim 16 wherein the at least one interconnect structure is disposed in an opening of the flex connector.

20. The structure of claim 19 wherein the opening in the flex connector comprises a PGA cavity.

21. The structure of claim 16 wherein the at least one interconnect structure comprises at least one PGA interconnect structure.

22. The structure of claim 16 wherein the at least one interconnect structure is disposed in an end portion of the interposer.

23. The structure of claim 21 wherein the at least one interconnect structure comprises at least one PGA interconnect structure comprising a plated material disposed in vias in the interposer.

24. A structure comprising:
a patch structure disposed on an interposer;
a plurality of interconnect structures disposed above and on a top surface of the interposer, wherein the interconnect structures are disposed in an end portion of the interposer; and
a flex connector connected to the plurality of interconnect structures, wherein the plurality of interconnect structures are disposed within flex connector openings.

25. The structure of claim 24 further comprising a system, wherein the system comprises: a bus communicatively coupled to the structure; and a DRAM communicatively coupled to the bus.

26. The structure of claim 24 wherein the structure comprises a portion of a server package.

27. The system of claim 24 wherein the flex connector is disposed adjacent the patch structure.

28. The structure of claim 24 further comprising a die attached to the patch structure.

29. The structure of claim 24 wherein a height between a top surface of the interposer and a bottom surface of the flex connector is below about 200 microns.

30. The structure of claim 24 further comprising wherein the patch structure comprises a high density interface patch structure.

* * * * *